United States Patent [19]
Evans et al.

[11] Patent Number: 5,831,291
[45] Date of Patent: Nov. 3, 1998

[54] INSULATED GATE BIPOLAR TRANSISTORS

[75] Inventors: Michael J. Evans; Robert C. Irons, both of Wiltshire, United Kingdom

[73] Assignee: Westinghouse Brake and Signal Holdings Limited, United Kingdom

[21] Appl. No.: 801,828

[22] Filed: Feb. 14, 1997

[30] Foreign Application Priority Data

Mar. 18, 1996 [GB] United Kingdom ............... 9605672

[51] Int. Cl.⁶ ..................................... H01L 29/74
[52] U.S. Cl. .................. 257/137; 257/152; 257/153; 257/173; 257/328; 257/341
[58] Field of Search ............................. 257/133, 135, 257/137, 152, 153, 173, 327, 328, 341

[56] References Cited

U.S. PATENT DOCUMENTS 5,291,050  3/1994  Nishimura ........................... 257/340

FOREIGN PATENT DOCUMENTS 0 237 932 A2  9/1987  European Pat. Off. .
0 649 176 A2  4/1995  European Pat. Off. .

OTHER PUBLICATIONS

Venkatraman, Prasad and B. Jayant Baliga, "Large Area MOS–Gated Power Devices Using Fusible Link Technology", *IEEE Transactions on Electron Devices*, vol. 43, No. 2, pp. 347–351 (Feb. 1996).

*Primary Examiner*—Minh-Loan Tran
*Attorney, Agent, or Firm*—Darby & Darby, P.C.

[57]  ABSTRACT

A semiconductor device comprises a plurality of IGBT-like cells arranged in groups on a single wafer of silicon. Each group of cells has a unified gate structure and a unified source structure electrically insulated therefrom but physically overlying it. The gate structure of each group of cells is brought via a removable link to a single gate electrode for the whole device, so that the gate connection to any group of cells may be broken by removing the link, thus disabling the corresponding group of cells. Also, each group of cells is provided separately with a built-in controlled shunt conductance between its source structure and its gate structure.

6 Claims, 4 Drawing Sheets

INSULATED GATE BIPOLAR TRANSISTORS

FIELD OF THE INVENTION

The present invention relates to insulated gate bipolar transistors (IGBT's) which are non-latching, i.e. revert to the off-state when no gate signal is applied or the gate electrode is shorted to the source.

BACKGROUND OF THE INVENTION

IGBT-type devices require very fine geometry with the consequent probability of defects affecting device performance. Since the various cells of a device operate in parallel, a fault giving rise to a cell in permanent conduction is catastrophic. The multitude of cells required in large, high power devices therefore presents particularly acute problems in manufacture.

A variety of methods of circumventing this problem have been used in the manufacture of large devices. They include the assemblage of a plurality of selected smaller units in a single encapsulation or leaving the source contacts of faulty parts of a single silicon wafer open circuit. The limitations of such approaches have greatly constrained the efficiency of device utilisation. In particular, the ability to clamp a device between two large electrodes to act as efficient current carriers and to remove heat bifacially, as is commonly done with conventional power semiconductors, has been lost. Furthermore, the necessity to make large devices by composite encapsulation of a collection of smaller units increases the total periphery of the main voltage blocking junction and virtually limits the design of such junctions to the planar variety with consequent surrender of available area to the surface guard-ring structures required for high voltage blocking capability.

EP-A-0 237 932 and EP-A-0 649 176 each discloses a device comprising a plurality of IGBT-like cells arranged in groups on a single wafer of silicon, each group of cells having a unified gate structure and a unified source structure electrically insulated therefrom but physically overlying it.

The article entitled "Large Area MOS-Gated Power Devices Using Fusible Link Technology", P. Venkatraman & B. Jayant Baliga, "IEEE Transactions on Electric Devices", Vol. 43, No. 2, February 1996, discloses a large area MOS gated power device which is partitioned into a number of smaller segments. The sources of the segments are shorted by a source metal layer which goes over the top of the entire device. The gate of each segment is connected to a common gate bus through a fusible link so that a defective segment may be isolated via its fusible link.

SUMMARY OF THE INVENTION

According to the present invention, there is provided a semiconductor device comprising a plurality of IGBT-like cells arranged in groups on a single wafer of silicon, wherein each group of cells has a unified gate structure and a unified source structure electrically insulated from the gate structure but physically overlying it, the gate structure of each group of cells is brought via a removable link to a single gate electrode for the whole device, so that the gate connection to any group of cells may be broken by removing the link, thus disabling the corresponding group of cells, and each group of cells is provided separately with a built-in controlled shunt conductance between its source structure and its gate structure.

Normally it will be the existence of an unintended conductance between the source structure and the gate structure of a group of cells which makes disconnection necessary, but in case the unintended conductance is unreliable, the controlled conductance of the built-in controlled shunt conductance is utilised to ensure off-state stability in the disabled group.

The procedure and means by which appropriate disconnections may be achieved consist of first identifying a group of cells containing a fault, i.e. a substantially higher conductance between its gate structure and its source structure than that provided by the intentional shunt conductance, and then removing the gate link, e.g. by discharge of a current pulse, laser irradiation, chemical etching, mechanical attrition etc.

Electrode surfaces of the source structures of all the groups are preferably coplanar and simultaneously contacted by a planar electrically and thermally conducting member to provide a large area electrical and thermal sink.

The face of the silicon wafer remote from said member may provide an emitter common to all cells, and may be provided with a further conductive member which may be either soldered to or urged into contact with a supporting electrode of an extent substantially that of said planar member.

A principal voltage blocking junction of the device may terminate at an angled surface of the silicon disc at its outer periphery.

BRIEF DESCRIPTION OF THE DRAWINGS

The present invention will now be described, by way of example, with reference to the accompanying drawings, in which.

DESCRIPTION OF PREFERRED EMBODIMENTS

Figure 1:
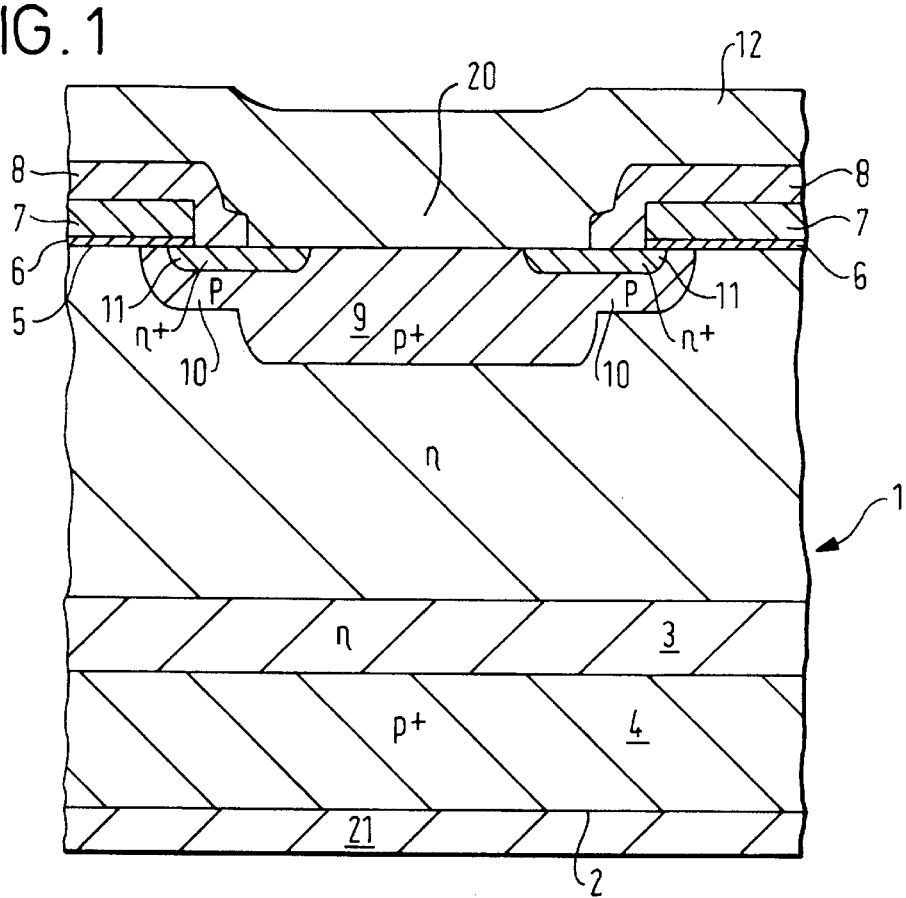
FIG. 1 shows the typical structure of a single IGBT cell.
Figure 2:
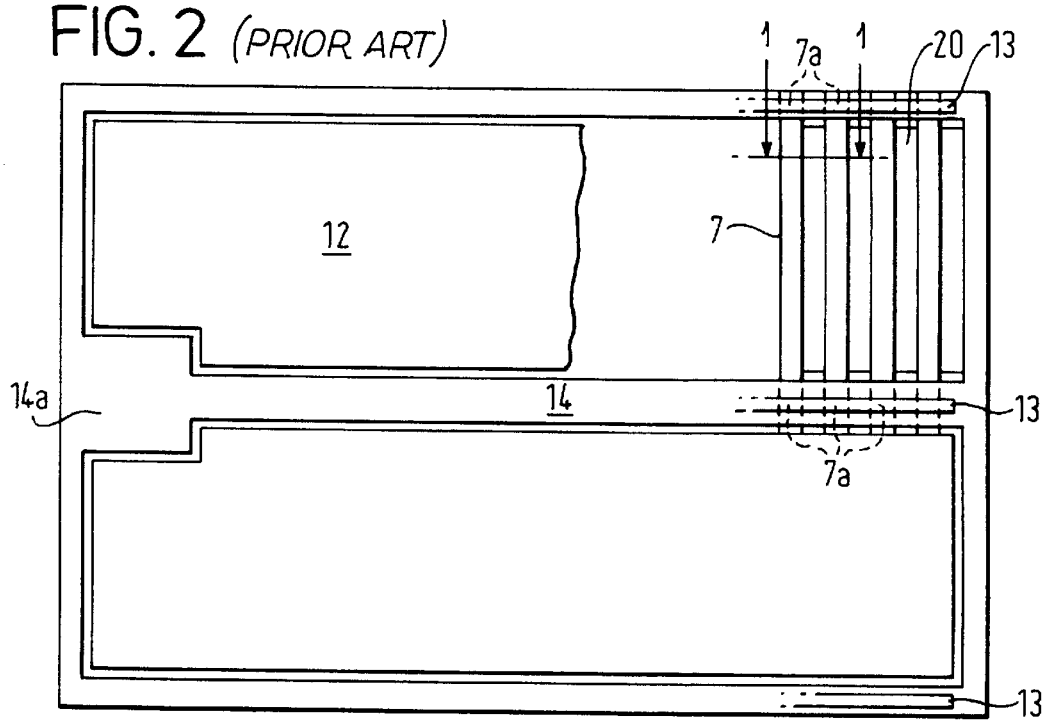
FIG. 2 shows an arrangement of groups of cells as used in some prior art devices.

Referring to FIG. 1, there is shown in cross-section the typical structure of a single IGBT cell and in FIG. 2 is shown an arrangement of cells as may be found in the prior art. A wafer 1 of n-type silicon has at a first face 2 regions 3 and 4 formed respectively by successive diffusions of n- and p-type impurities. At its opposing face 5 the wafer 1 has a fine pattern of narrow strip windows 20 in a surface mask consisting of a thin layer 6 of thermally grown silicon dioxide overlaid by a chemical vapour deposited (CVD) layer 7 of doped polycrystalline silicon further overlaid by a CVD dielectric layer 8 of silicon dioxide. Each window 20 defines the central area of a single IGBT cell. Within the window is a diffused-in p-type dopant region 9, the peripheral limit of which is extended by the implanting and diffusion of a lower concentration of p-type dopant 10 followed by a further implant of n+ dopant 11 aligned therewith by the use of the same window as a masking agent but diffused to a lesser extent so as to lie entirely within the boundary of the extended p-type region 10. The main electrode at the second face is the source electrode which consists of metallisation 12 deposited and sintered so as to overlay the CVD dielectric layer 8 and to contact the areas within the windows over the length of the n-type doped region 11 as shown in FIG. 2. (FIG. 1 is a section through A–A1 of FIG. 2 and represents one cell). The polycrystalline silicon is exposed at the ends 7a of each cell by the subsequent formation of a further window 13 in the dielectric layer 8 to enable contact to be made to it as the gate electrode by a metallised layer 14 running around each group of cells to form a frame which electrically unites the ends of all such polycrystalline silicon strips. A number of such gate metallisation frames may be connected in common. The frame may include a widened area of metallisation 14a for use as a pad for the attachment of wire bonds. The face 2 of the wafer 1 is contacted by metallisation 21 or soldered to a heavy support electrode for connection as an anode electrode. Further information on the structure and fabrication of similar prior art devices may be found in MODERN POWER DEVICES by B Jayant Baliga; John Wiley and Sons, Inc., N.Y., 1987 [ISBN 0-471-63781-5] (see p.350ff).

Figure 3:
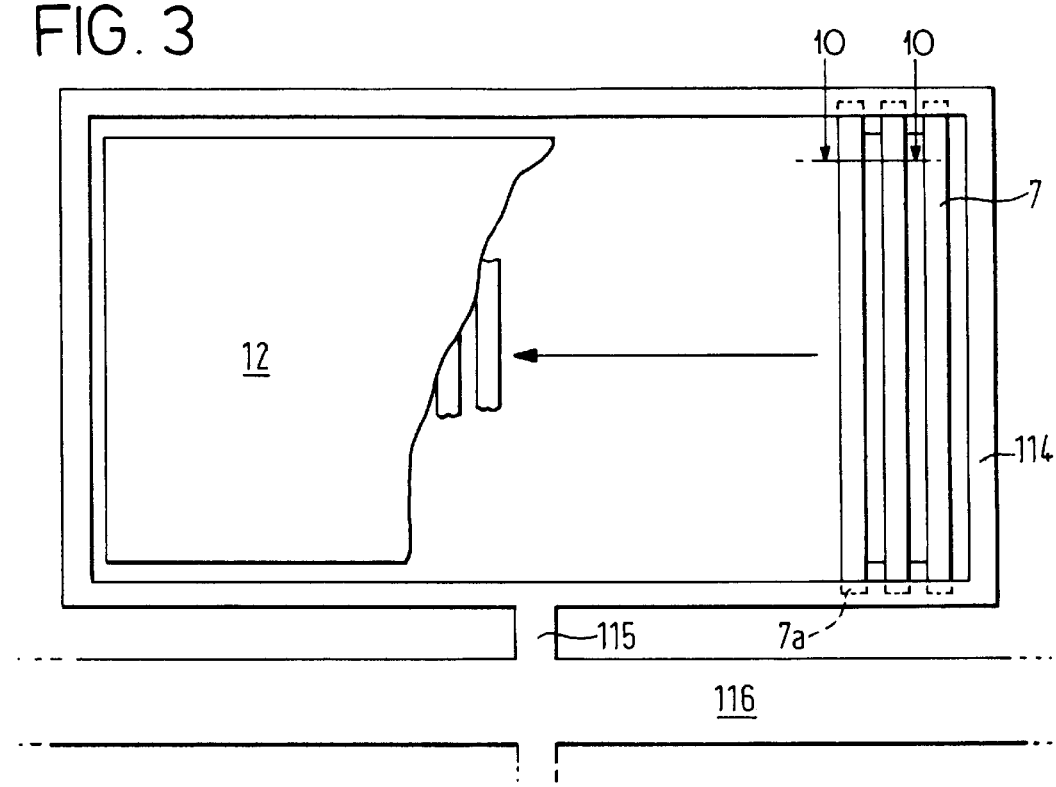
FIG. 3 shows a single group of cells as used in an embodiment of the present invention.

Referring now to FIG. 3, a group of the strip-like cells of FIG. 1 (which is also a section through A–Al of FIG. 3) is similarly surrounded by a connecting frame for the ends 7a of its polycrystalline silicon gate electrodes 7. In contrast to FIG. 3 however, this frame is a secondary frame 114, so termed because it is confined to connecting the ends of the gate electrodes of that group alone while other secondary frames perform the same function for other groups of cells. Each such secondary frame 114, each forming a unified gate structure, is connected by a removable link 115 to a metallised area constituting a primary gate frame 116. Any group of cells surrounded by a secondary gate frame 114 may have its gates disconnected from the primary frame 116 by removing the appropriate removable link 115. Provided that the group of cells served by the disconnected secondary frame now remains totally inactive, it will play no part in the operation of the device. Thus, any group of cells which can be identified as containing a potential cause of malfunction due to shorting out of the gate signal through failed insulation between gate 7 and the unified source structure 12 of the group, may have its secondary frame 114 disconnected from the primary frame 116 at the removable link 115 in order to restore satisfactory operation of the remaining groups of cells. A variety of suitable methods of severing a link 115 are known, including (but without limitation thereto) chemical erosion, attrition, electrical current pulse and laser irradiation.

Figure 4:
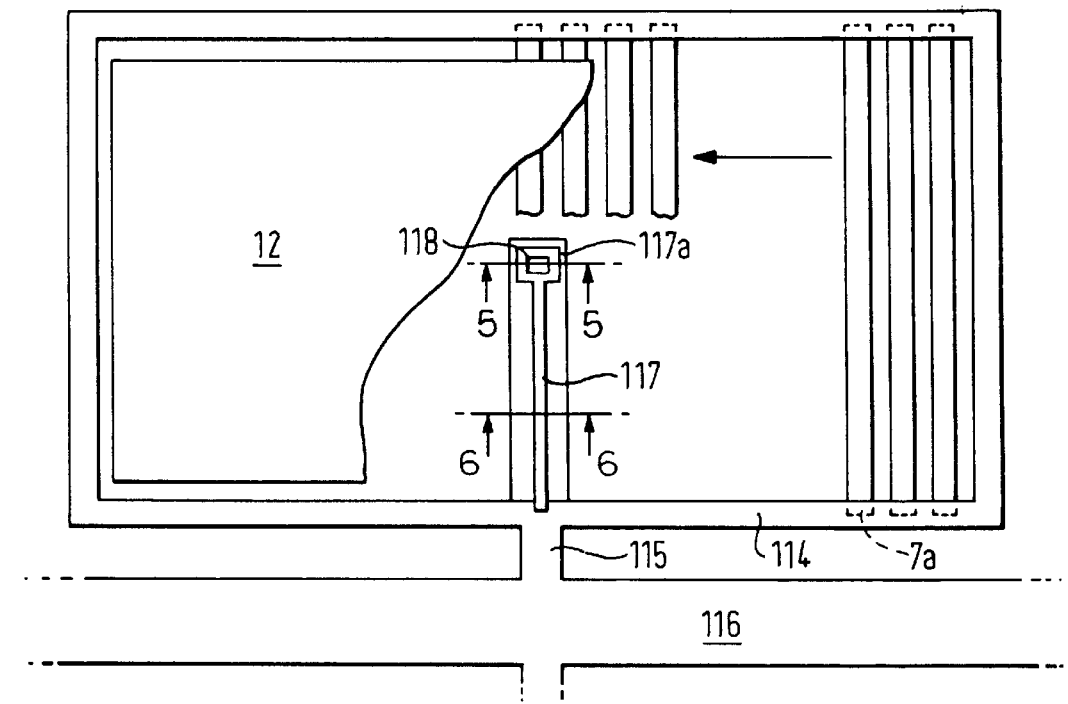
FIG. 4 shows a single group of cells as used in the embodiment of the present invention.
Figure 5:
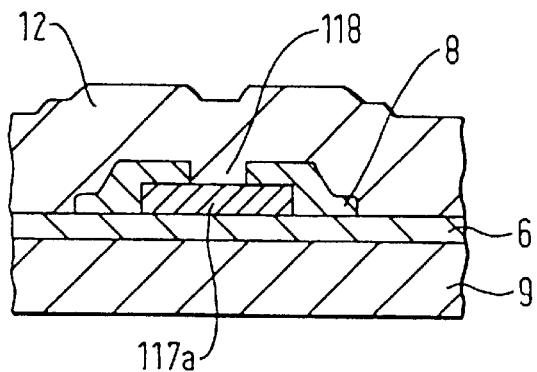
FIG. 5 is a section through B–B1 in FIG. 4.
Figure 6:
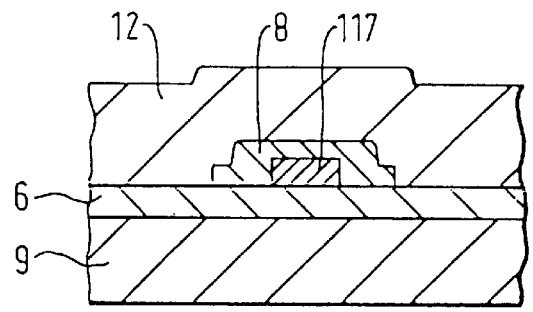
FIG. 6 is a section through C–C1 in FIG. 4.

Referring now to FIG. 4, there is shown an additional feature which is applied in conjunction with each secondary gate frame 114 to provide a device in accordance with the present invention. The presence of a short circuit between a gate 7 and source 12 due to lack of insulation therebetween would be expected to hold the affected group of cells in a permanently off state. However, since such a feature is present only as a fault, it may not be reliable. A built-in controlled shunt conductance between secondary frame 114 and the source 12 is therefore be added to ensure reliable behaviour. For this purpose, an additional strip 117 of polycrystalline silicon is deposited across the surface of the gate oxide layer 6 extending from the secondary frame 114 into each group of cells and overlaid by CVD oxide 8. The inward end of the strip 117 is enlarged to form a contact area 117a which is contacted through a window 118 in the oxide layer 8 by the source 12. The electrical resistance of the polycrystalline silicon strip 117 is adjusted (e.g. by doping) to provide the required conductance between the metallisation layers 114, 12 of the secondary frame and the source respectively. The construction in cross-section through B–B1 and C–C1 is shown in FIGS. 5 and 6 respectively.

Figure 7:
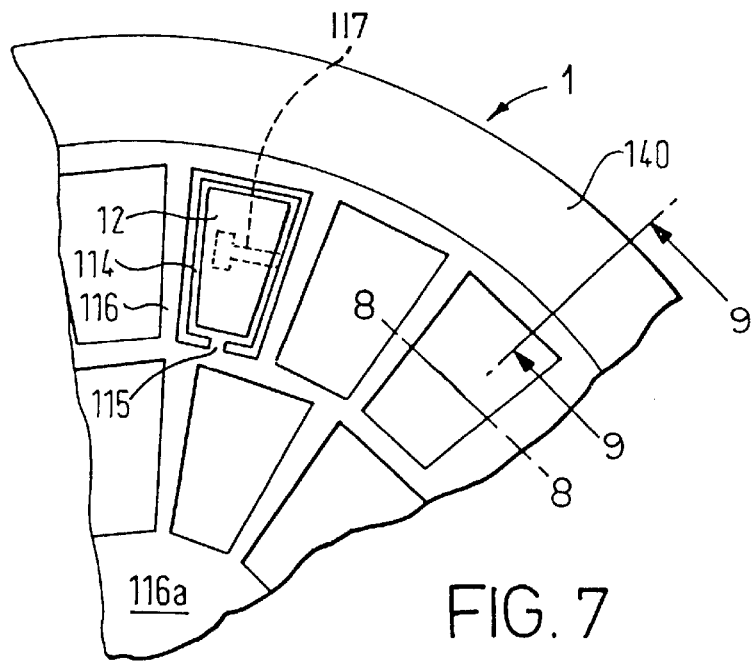
FIG. 7 shows an arrangement of a group of cells on a single wafer with a peripheral blocking termination according to another embodiment of the present invention.
Figure 8:
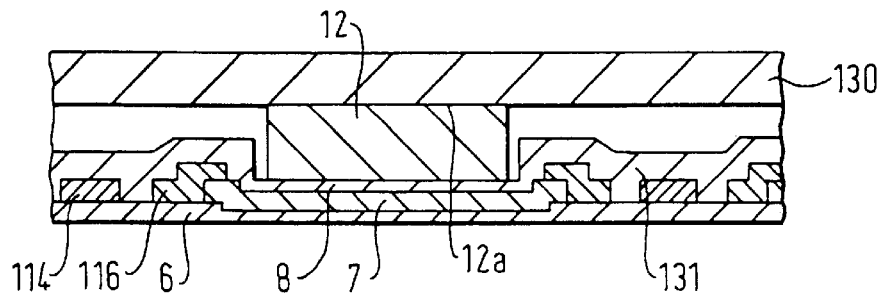
FIG. 8 is a section through A–A1 in FIG. 7.
Figure 9:
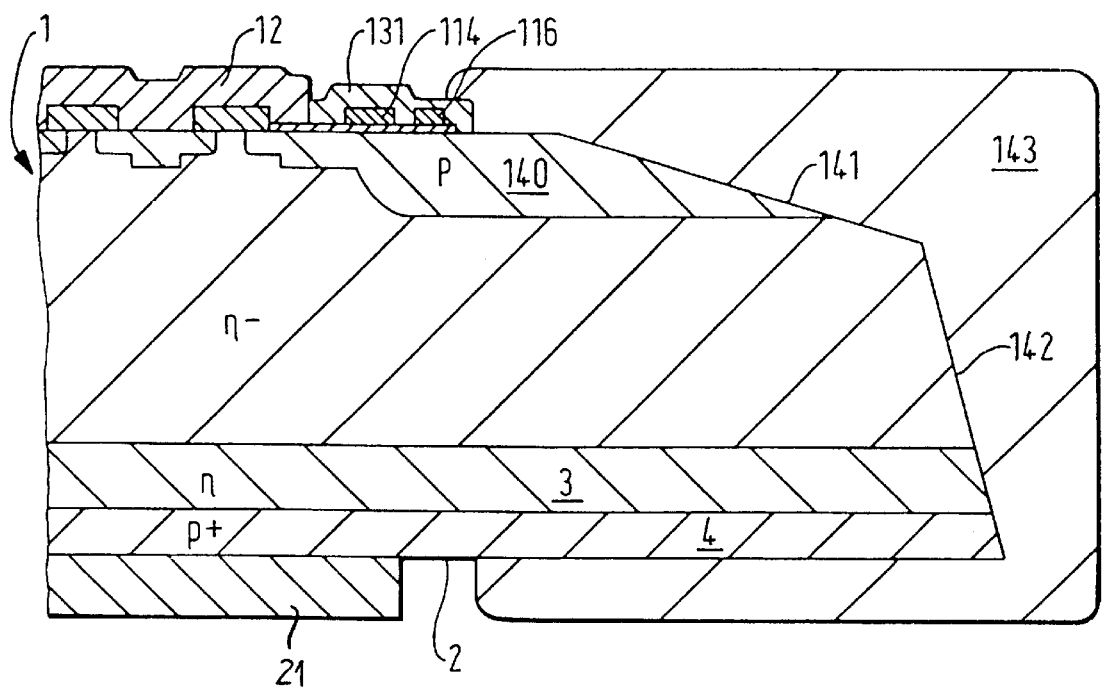
FIG. 9 is a section through B–B1 in FIG. 7.

Referring now to FIG. 7, there is shown an assembly of groups of IGBT cells arranged on a disc comprising a single wafer of silicon, using the same enumeration as the preceding figures where appropriate. Each group of cells fills a trapezoidal secondary gate frame 114 with the length of window strips aligned to the parallel sides of the trapezium and suitably graded in length. FIG. 8 is a cross-section through A–A1 in FIG. 7 (i.e. along the mid line between two strip windows) and FIG. 9 is a cross-section through B–B1 in FIG. 7 (i.e. perpendicular to the line of the cells) and extends radially outwards through the edge of the silicon disc 1 to illustrate how the voltage blocking junction(s) may be terminated. The arrangement of the trapezoidal groups of cells enables efficient use to be made of the silicon disc 1. The primary gate frame 116 connecting all the secondary frames 114 via their removable links 115 is conveniently unified at the centre of the disc to form a gate contact area 116a. Conventionally, a wire bond or bonds would be made in this area but it is more convenient to use a resilient contact. Connection to all necessary parts of the source layers 12 is made by pressing a large area flat plate 130 (e.g. a thick molybdenum disc) against their surfaces 12a. Optionally a dielectric coating 131 (e.g. a polyimide varnish) may be applied over the primary and secondary gate frame areas and over the removable links therebetween to preclude the possibility of any conductive foreign body or metal extruded by the subsequent actions of thermal stress and compressive forces causing a short circuit between the source and gate electrodes. The edge region of the silicon disc 1 shown includes a deeper diffused p-type zone 140 having a suitable dopant concentration grading as might be used for the forward blocking junction of a thyristor. By this means, a conventional double bevel with negative bevel 141 and positive bevel 142 followed by etching of the bevelled surfaces and application of a dielectric coating 143 of silastomer or resin, may be used. Alternative profiles (e.g. a double positive bevel) may be employed as are known in the art. Devices with high reverse blocking voltage may also be made by omitting the n-buffer layer 3 and suitably thickening the original n-type silicon disc 1. The face 2, providing an emitter common to all cells, is provided with anode metallisation 21, which may be soldered to or urged into contact with a supporting electrode of an extent substantially that of plate 130.

What is claimed is:

1. A semiconductor device comprising a plurality of IGBT-like cells arranged in groups on a single wafer of silicon, wherein each group of cells has a unified gate structure and a unified source structure electrically insulated from the gate structure but physically overlying it, wherein the gate structure of each group of cells is brought via a removable link to a single gate electrode for the whole device, so that the gate connection to any group of cells may be broken by removing the link, thus disabling the corresponding group of cells, and each group of cells is provided separately with a built-in controlled shunt conductance between its source structure and its gate structure.

2. A device according to claim 1, wherein electrode surfaces of the source structures of all the groups are coplanar and simultaneously contacted by a planar electrically and thermally conducting member.

3. A device according to claim 2, wherein the face of the silicon wafer remote from said member provides an emitter common to all cells and is provided with a further conductive member.

4. A device according to claim 3, wherein said further conductive member is soldered to a supporting electrode of an extent substantially that of said planar member.

5. A device according to claim 3, wherein said further conductive member is urged into contact with a supporting electrode of an extent substantially that of said planar member.

6. A device according to claim 1, wherein a principal voltage blocking junction of the device terminates at an angled surface of the silicon disc at its outer periphery.

* * * * *